United States Patent [19]
Kawai et al.

[11] Patent Number: 6,054,793
[45] Date of Patent: Apr. 25, 2000

[54] PIEZOELECTRIC RESONATOR METHOD FOR ADJUSTING FREQUENCY OF PIEZOELECTRIC RESONATOR AND COMMUNICATION APPARATUS INCLUDING PIEZOELECTRIC RESONATOR

[75] Inventors: Yutaka Kawai; Takeshi Yamazaki, both of Ishikawa-ken, Japan

[73] Assignee: Murata Manufacturing Co., Ltd., Japan

[21] Appl. No.: 09/159,713

[22] Filed: Sep. 24, 1998

[30] Foreign Application Priority Data

Oct. 3, 1997 [JP] Japan ..................................... 9-287667
Sep. 1, 1998 [JP] Japan ..................................... 10-247202

[51] Int. Cl.⁷ ................................................... H01L 41/08
[52] U.S. Cl. ........................................... 310/312; 310/328
[58] Field of Search ...................................... 310/312, 328

[56] References Cited

U.S. PATENT DOCUMENTS

| | | | |
|---|---|---|---|
| 4,190,937 | 3/1980 | Massa | 29/25.35 |
| 4,633,119 | 12/1986 | Thompson | 310/325 |
| 5,118,982 | 6/1992 | Inoue et al. | 310/366 |
| 5,241,236 | 8/1993 | Sasaki et al. | 310/358 |
| 5,252,883 | 10/1993 | Kondo | 310/328 |
| 5,469,011 | 11/1995 | Safabakshs | 310/325 |
| 5,736,911 | 4/1998 | Watanabe | 310/312 |
| 5,793,148 | 8/1998 | Rabe | 310/328 |
| 5,925,970 | 7/1999 | Unami et al. | 310/328 |

*Primary Examiner*—Thomas M. Dougherty
*Attorney, Agent, or Firm*—Graham & James LLP

[57] ABSTRACT

A base member of a piezoelectric resonator includes a laminated body having a plurality of piezoelectric layers which are alternately polarized in opposite directions along the longitudinal direction of the base member and inner electrodes provided between the piezoelectric layers. On a first side surface of the base member, each of two external electrodes is arranged so as to be connected to one of two groups of alternate inner electrodes. Cut portions for adjusting a frequency of the piezoelectric resonator to a higher frequency are respectively formed at edge portions of the base member at opposite ends in the longitudinal direction of a second side surface opposite from the first side surface of the base member.

20 Claims, 12 Drawing Sheets

# PIEZOELECTRIC RESONATOR METHOD FOR ADJUSTING FREQUENCY OF PIEZOELECTRIC RESONATOR AND COMMUNICATION APPARATUS INCLUDING PIEZOELECTRIC RESONATOR

BACKGROUND OF THE INVENTION

1. Field of the Invention

The present invention relates to a piezoelectric resonator, a method for adjusting a frequency of the piezoelectric resonator and a communication apparatus including the piezoelectric resonator and more particularly, a piezoelectric resonator used in an electronic component such as a vibrator, a discriminator or a filter.

2. Description of the Related Art

In a conventional piezoelectric resonator, external electrodes are respectively provided on two major surfaces of a piezoelectric substrate in the form of a rectangular or square plate. The piezoelectric substrate is polarized in the direction of the thickness thereof, and an electric field is applied along the thickness direction of the piezoelectric substrate by inputting a signal between the electrodes to cause the piezoelectric substrate to vibrate in a direction parallel to the major surface of the piezoelectric substrate.

This piezoelectric resonator is an unstiffened type in which the direction of an electric field and the direction of polarization differ from the direction of vibration. The unstiffened type of piezoelectric resonator has an electromechanical coefficient smaller than that of a piezoelectric resonator of a stiffened type in which the direction of an electric field and the direction of polarization are the same as the direction of vibration. The unstiffened type piezoelectric resonator therefore has a comparatively small difference ΔF between a resonant frequency and an antiresonant frequency. This leads to the disadvantage of restricting a bandwidth when the piezoelectric resonator is used as a filter which results in a very small bandwidth when the piezoelectric resonator is used as a filter. Therefore, the degree of freedom in characteristic design of the piezoelectric resonator or an electronic component such as a filter or vibrator using the piezoelectric resonator is low.

The above-described piezoelectric resonator including a piezoelectric substrate in the form of a rectangular or square plate uses first-order resonance of longitudinal vibration. In the above-described piezoelectric resonator, however, strong spurious resonances in high-order modes of odd-number modes, such as the third-order and the fifth-order modes, occur because of the structure of the resonator.

In addition, while the first-order resonance of vibration in the spreading direction is used in the above-described piezoelectric resonator using a piezoelectric substrate in the form of a rectangular or square plate, the possibility of occurrence of strong spurious resonance such as a triple wave in the spreading direction or a spurious resonance in a thickness mode is high.

The applicant of the present invention has previously proposed a piezoelectric resonator of a laminated structure in which spurious resonances are reduced and in which the difference ΔF between a resonant frequency and an antiresonant frequency is large. FIG. 24 illustrates an example of such a piezoelectric resonator having a laminated structure. A piezoelectric resonator 1 shown in FIG. 24 has a laminated structure such that a plurality of piezoelectric layers 3 and a plurality of inner electrodes 4 constituting a base member 2 having a longitudinal direction are alternately laminated and the plurality of piezoelectric layers 3 are polarized along the longitudinal direction of the base member 2. The piezoelectric resonator 1 of this laminated structure is a stiffened type in which the direction of polarization, the direction of electric fields and the direction of vibration are the same. Therefore, the piezoelectric resonator 1 has a larger electromechanical coefficient and a larger difference ΔF between a resonant frequency and an antiresonant frequency in comparison with unstiffened type piezoelectric resonators in which the direction of vibration differs from the direction of polarization and the direction of an electric field. Further, in the piezoelectric resonator 1 having the laminated structure, vibration in a mode such as a width mode or a thickness mode which is different from the fundamental vibration cannot occur easily because of the effect of the stiffened type. In the piezoelectric resonator 1 having the laminated structure, end portions of inner electrodes 4 are exposed at each of the side surfaces of the base member 2. Therefore, the end portions of a first of the two groups of inner electrodes 4 alternating with each other at a first side surface of the base member 2 are covered with an insulating film 5a at one end of the base member 2 in the width direction, and an external electrode 6a is thereafter provided so as to be connected to the other alternate inner electrodes 4. Further, the end portions of the other alternate inner electrodes 4 at the first side surface of the base member 2 are covered with an insulating film 5b at the other end of the base member 2 in the width direction, and an external electrode 6b is thereafter provided so as to be connected to the alternate inner electrodes 4 on which insulating film 5b is provided.

However, if the piezoelectric resonator 1 having the laminated structure shown in FIG. 24 is mass-produced, there is a possibility of failure to obtain a desired resonant frequency or antiresonant frequency due to processing or manufacturing non-uniformity or the like. A method proposed by the applicant and disclosed in Japanese Patent Laid-open Publication No. 197824/1997 can be used as a frequency adjustment method for reducing an obtained frequency to a desired frequency in a situation where the obtained frequency is higher than the desired resonant or antiresonant frequency. However, no method has been proposed as a frequency adjustment method for increasing an obtained frequency to a desired frequency in a situation where the obtained frequency is lower than the desired resonant or antiresonant frequency. With respect to a piezoelectric resonator in which longitudinal vibration is excited, a method of increasing the length of the base member during cutting of surfaces at the ends in the longitudinal direction may be used since a frequency is determined by the length of the base member. In such a case, however, resulting resonator elements vary in length when adjustment is made in order to achieve one desired common frequency. If this process is to be automated, it is necessary to adapt the process in a complicated manner for the desired effect, i.e., jigs made according to the exact length of the piezoelectric resonator are required, and so on. Automation under such conditions is difficult, and a variation in characteristics other than the resonant and antiresonant frequencies also results. In practice, therefore, it is difficult to use such a method.

SUMMARY OF THE INVENTION

To overcome the problems described above, the preferred embodiments of the present invention provide a piezoelectric resonator in which spurious resonance is significantly reduced, which has a large difference ΔF between a resonant frequency and an antiresonant frequency, and which has a frequency adjusted to a higher frequency.

In addition, the preferred embodiments of the present invention provide a method for adjusting a frequency of a piezoelectric resonator which makes it possible to easily adjust a frequency of a piezoelectric resonator having reduced spurious resonance and having a large difference ΔF between a resonant frequency and an antiresonant frequency without changing the length of the base member.

Preferred embodiments of the present invention also provide a communication apparatus using a piezoelectric resonator in which spurious resonance is significantly reduced, which has a large difference ΔF between a resonant frequency and an antiresonant frequency, and which has a frequency adjusted to a higher frequency.

According to one preferred embodiment of the present invention, a piezoelectric resonator includes a base member having a longitudinal direction and adapted to be vibrated in the longitudinal vibration, a plurality of inner electrodes arranged substantially perpendicular to the longitudinal direction of the base member and arranged along the longitudinal direction of the base member while being spaced apart from each other, a pair of external electrodes provided on a surface of the base member and connected to the internal electrodes, the base member including a plurality of piezoelectric material layers laminated to each other, the inner electrodes being provided on surfaces of the piezoelectric material layers substantially perpendicular to the longitudinal direction of the base member, the piezoelectric material layers being polarized along the longitudinal direction of the base member, and the base member having at least one cut portion at an edge portion thereof so as to adjust a resonant frequency of the piezoelectric resonator.

In the above described piezoelectric resonator, the cut portion may be located at corner portions of the base member.

The preferred embodiments of the present invention also provide a method for adjusting a frequency of a piezoelectric resonator including the steps of providing a base member having a longitudinal direction and being adapted to be vibrated in the longitudinal vibration, a plurality of inner electrodes arranged substantially perpendicular to the longitudinal direction of the base member and arranged along the longitudinal direction of the base member and being spaced apart from each other, and a pair of external electrodes provided on a surface of the base member and connected to the internal electrodes, the base member including a plurality of piezoelectric material layers laminated to each other, the inner electrodes being provided on surfaces of the piezoelectric material layers substantially perpendicular to the longitudinal direction of the base member, and the piezoelectric material layers being polarized along the longitudinal direction of the base member, and removing at least a portion at edge portions of the base member.

In the above described method, the portion removed in the removing step may be located at corner portions of the base member.

The preferred embodiments of the present invention further provide a communication apparatus including a detector, wherein the detector comprises the piezoelectric resonator according to the preferred embodiment described above.

The preferred embodiments of the present invention further provide a communication apparatus including a band-pass filter, wherein the band-pass filter has a ladder-filter including the piezoelectric resonator according to the preferred embodiment described above.

The piezoelectric resonator in accordance with preferred embodiments of the present invention is preferably a stiffened type in which the direction of polarization of the piezoelectric layers and the direction of an electric field applied to the resonator are the same as the direction of vibration. Therefore, the resonator has a larger electromechanical coefficient and a larger difference ΔF between a resonant frequency and an antiresonant frequency in comparison with a piezoelectric resonator of an unstiffened type in which the direction of vibration differs from the direction of polarization and the direction of an electric field. Because of use of the effect of the stiffened type, vibration cannot occur easily in a mode such as a width mode or in a thickness mode that is different from fundamental vibration in a longitudinal vibration mode.

According to preferred embodiments of the present invention, a frequency of a piezoelectric resonator in which spurious resonance is limited and which has a large difference ΔF between a resonant frequency and an antiresonant frequency can be adjusted to a higher frequency. Therefore, the piezoelectric resonator is able to be manufactured with an improved yield of non-defective products.

Further, according to preferred embodiments of the present invention, the frequency can be adjusted to a higher frequency without changing the length of the piezoelectric resonator and without changing the waveform.

In a case where an electronic component is manufactured to include the piezoelectric resonator of preferred embodiments of the present invention, the component can be designed as a chip type electronic component which can be easily mounted on a circuit board or the like.

Further, according to preferred embodiments of the present invention, a communication apparatus including the piezoelectric resonator in which spurious resonance is limited, a difference ΔF between a resonant frequency and an antiresonant frequency is large, and a frequency that can be adjusted to a higher frequency can be obtained.

Other features and advantages of the present invention will become apparent from the following description of the invention which refers to the accompanying drawings.

DETAILED DESCRIPTION OF PREFERRED EMBODIMENTS

Figure 1:
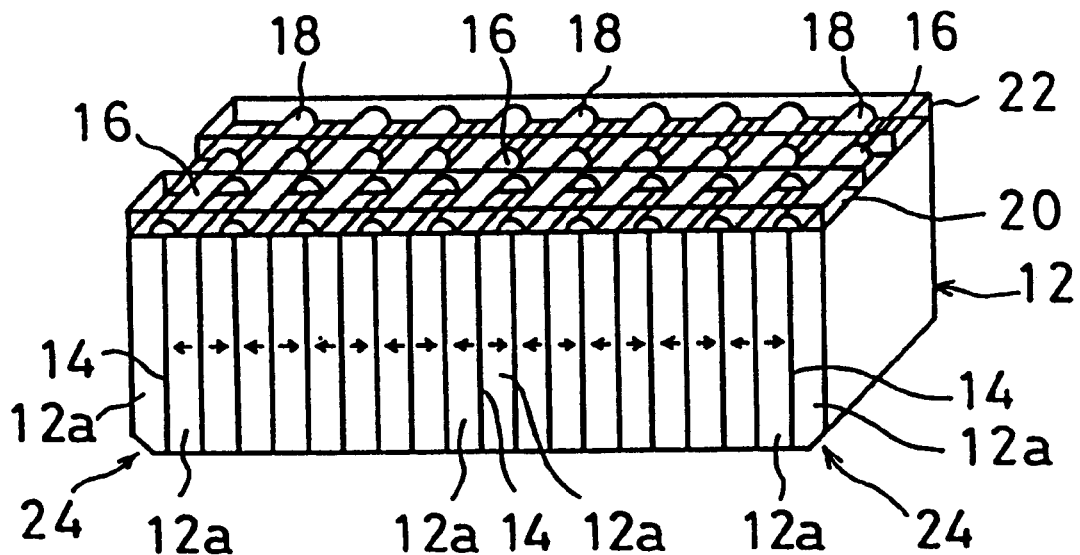
FIG. 1 is a diagram showing a preferred embodiment of a piezoelectric resonator in accordance with the present invention in such a position that its external electrodes faces upward.
Figure 2:
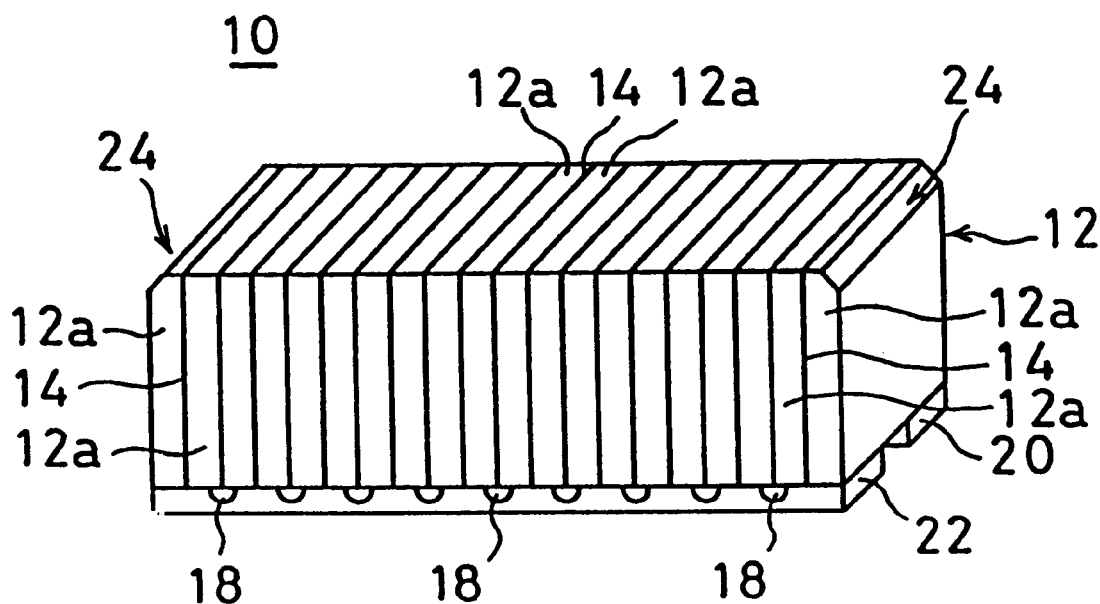
FIG. 2 is a diagram showing the piezoelectric resonator shown in FIG. 1 in such a position that the external electrode faces downward.

Referring to FIGS. 1 and 2, the piezoelectric resonator 10 includes a base member 12 in the form of, for example, a substantially rectangular block. The base member 12 includes, for example, a lamination of about twenty piezoelectric material layers 12a of a piezoelectric ceramic. These piezoelectric material layers 12a are preferably formed so as to have a uniform size. These piezoelectric material layers 12a are polarized along the longitudinal direction of the base member 12 so that the directions of polarization of each adjacent pair of the piezoelectric material layers 12a are opposite to each other, as indicated by the arrows in FIG. 1. However, the piezoelectric material layers 12a at the opposite ends are preferably not polarized. Alternatively, the piezoelectric material layers 12a at the opposite ends may also be polarized.

Inner electrodes 14 are provided between the piezoelectric layers 12a of the base member 12. Thus, the inner electrodes 14 are disposed so as to be substantially perpendicular to the longitudinal direction of the base member 12 while being spaced apart from each other in the longitudinal direction of the base member 12. Also, these inner electrodes 14 are provided over the entire areas of the major surfaces of the piezoelectric layers 12a. Thus, these inner electrodes 14 are provided so as to be exposed at the four side surfaces of the base member 12.

One of the two groups of inner electrodes 14 alternating with each other at one side surface of the base member 12 are covered with insulating film 16 at one end of the base member 2 in the width direction, and the other alternate inner electrodes 14 are covered with insulating film 18 at the other end of the base member 12 in the width direction.

At the one side surface of the base member 12, an external electrode 20 is provided over the insulating film 16 provided on the alternate inner electrodes 14 and so on so as to be connected to the other alternate inner electrodes 14. Further, at the one side surface of the base member 12, an external electrode 22 is provided over the insulating film 18 provided on the other alternate electrodes 14 so as to be connected to the alternate inner electrodes 14.

Further, cut portions 24 each having a substantially slanted flat surface are respectively formed at edge portions of the base member 12 at opposite ends, in the longitudinal direction, of the side surface opposite from the one side surface of the base member 12 on which the external electrodes 20, 22 are disposed. The cut portions 24 are preferably formed by grinding, cutting or the like for the purpose of adjusting a resonant frequency or an antiresonant frequency of the piezoelectric resonator 10 to a higher frequency.

In this piezoelectric resonator 10, the external electrodes 20 and 22 are used as input and output electrodes. An electric field is applied between each adjacent pair of inner electrodes 14 by supplying a signal to the external electrodes 20 and 22. The piezoelectric layers 12a, except those at the opposite ends of the base member 12, are thereby made piezoelectrically active. Since in this arrangement electric fields in opposite directions are applied to the piezoelectric layers 12a polarized in the opposite directions, the piezoelectric layers 12a act so as to contract and expand as a whole along one direction. That is, an alternating current electric field in the longitudinal direction of the base member 12 is applied to each piezoelectric layer 12a by the inner electrodes 14 connected to the external electrodes 20 and 22 to cause a contracting and expanding drive force in the piezoelectric layer 12a such that fundamental vibration in the longitudinal vibration mode is generated through the piezoelectric resonator 10 with a node corresponding to the approximate center of the base member 12 in the longitudinal direction.

In this piezoelectric resonator 10, the direction of polarization of the piezoelectric layers 12a, the directions of electric fields applied by an input signal and the direction of vibration of the piezoelectric layers 12a are the same. That is, the piezoelectric resonator 10 is a stiffened type resonator. The piezoelectric resonator 10 has an electromechanical coefficient larger than that of unstiffened type piezoelectric resonators in which the direction of polarization and the direction of an electric field differ from the direction of vibration. Therefore, this piezoelectric resonator 10 has a larger difference ΔF between a resonant frequency and an antiresonant frequency in comparison with the conventional unstiffened type piezoelectric resonator. As a result, this piezoelectric resonator 10 can have a characteristic of a larger bandwidth in comparison with the conventional unstiffened type piezoelectric resonator.

Further, in this piezoelectric resonator 10, the capacitance of the resonator can be adjusted, for example, by adjusting the opposed area of the inner electrodes 14, the number of piezoelectric layers 12a and the number of inner electrodes 14, or the size of the piezoelectric layers 12a in the longitudinal direction of the base member 12. That is, the capacitance of the resonator can be increased by increasing the opposed area of the inner electrodes 14, by increasing the numbers of the piezoelectric layers 12a and the inner electrodes 14, or by reducing the size of the piezoelectric layers 12a in the longitudinal direction of the base member 22. Conversely, the capacitance of the resonator can be reduced by reducing the opposed area of the inner electrodes 14, by reducing the numbers of the piezoelectric layers 12a and the inner electrodes 14, or by increasing the size of the piezoelectric layers 12a in the longitudinal direction of the base member 12. Thus, the capacitance can be adjusted by adjusting the opposed area of the inner electrodes 14, the numbers of the piezoelectric layers 12a and the inner electrodes 14, or the size of the piezoelectric layers 12a in the longitudinal direction of the base member 12, so that the degree of freedom in capacitance design is high. Therefore, impedance matching with an external circuit can easily be achieved when the piezoelectric resonator 10 is mounted on a circuit board or the like.

Figure 3:
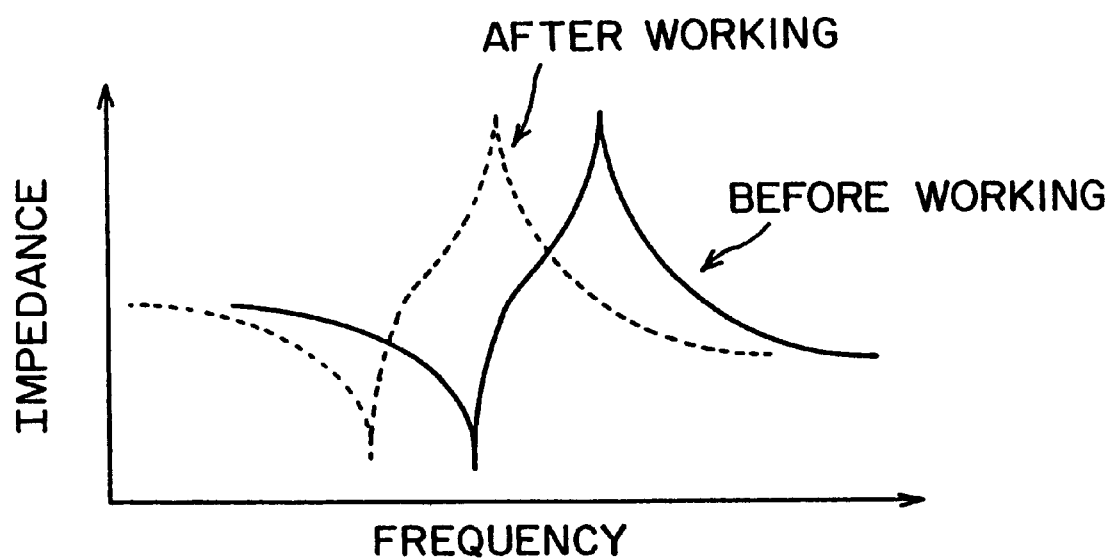
FIG. 3 is a graph showing a frequency characteristic of the piezoelectric resonator shown in FIGS. 1 and 2 before cut portions are formed (before processing) and a frequency characteristic of the piezoelectric resonator after cut portions have been formed (after processing).
Figure 24:
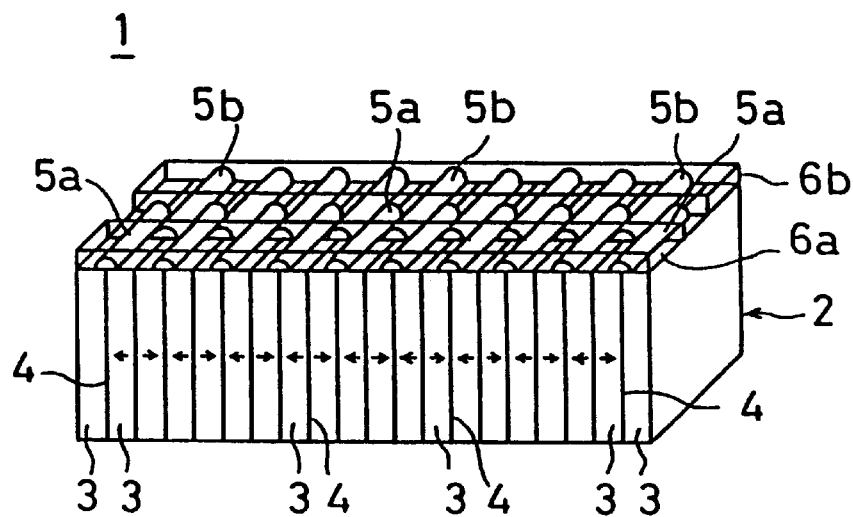
FIG. 24 is a diagram showing an example of a piezoelectric resonator of a laminated structure constituting the background of the present invention.

In contrast with the piezoelectric resonator 1 shown in FIG. 24, the piezoelectric resonator 10 shown in FIGS. 1 and 2 has cut portions 24 formed at edge portions of the base member 12 at the opposite ends in the longitudinal direction, whereby its frequency is adjusted to a higher frequency. FIG. 3 shows a frequency characteristic of the piezoelectric resonator 10 shown in FIGS. 1 and 2 before cut portions 24 are formed (before processing) and a frequency characteristic of the piezoelectric resonator 10 after cut portions 24 have been formed (after processing). In the piezoelectric resonator 10 shown in FIGS. 1 and 2, as is apparent from these characteristics, the frequency can be adjustably increased without a change in waveform by forming cut portions 24 at the edge portions of the base member 12 at the opposite ends in the longitudinal direction. Thus, frequency adjustment to a higher frequency can be performed without changing the length of the resonator body. Therefore, a plurality of piezoelectric resonators 10 shown in FIGS. 1 and 2 which are substantially equal to each other in a length dimension of the element can be handled. Thus, the piezoelectric resonator 10 can be adapted to an automated process and has stable characteristics while the resonant and antiresonant frequencies are changed.

Figure 4:
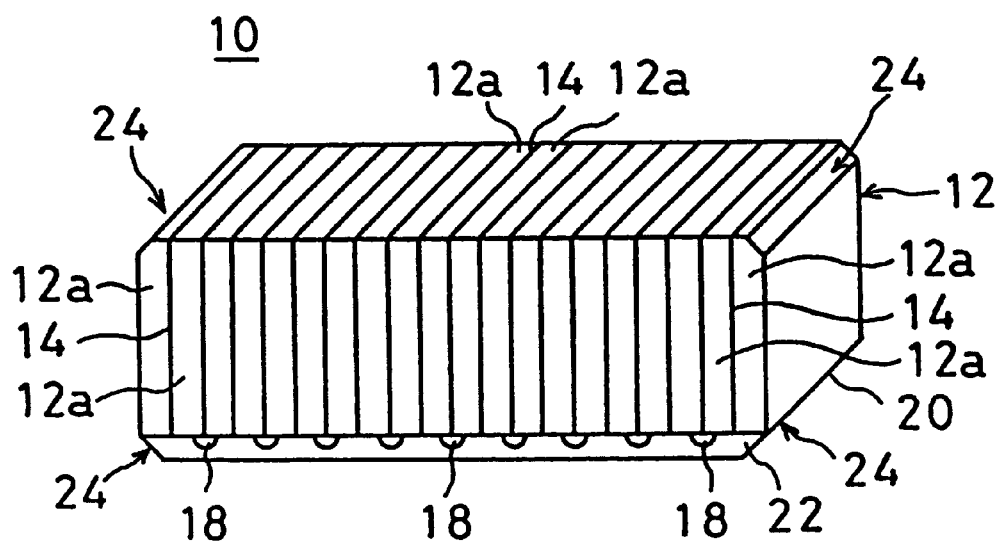
FIG. 4 is a diagram showing a modification of the piezoelectric resonator shown in FIGS. 1 and 2.

FIG. 4 is a diagram showing a modification of the piezoelectric resonator shown in FIGS. 1 and 2. In comparison with the piezoelectric resonator shown in FIGS. 1 and 2, the piezoelectric resonator shown in FIG. 4 is characterized in that cut portions 24 each having a substantially slanted flat surface are formed at edge portions of the base member 12 at the opposite ends in the longitudinal direction of each of two side surfaces of the base member 12 opposite from each other. That is, there is a total of four slanted surfaces formed on each of four edges of the resonator body as seen in FIG. 4.

Figure 5:
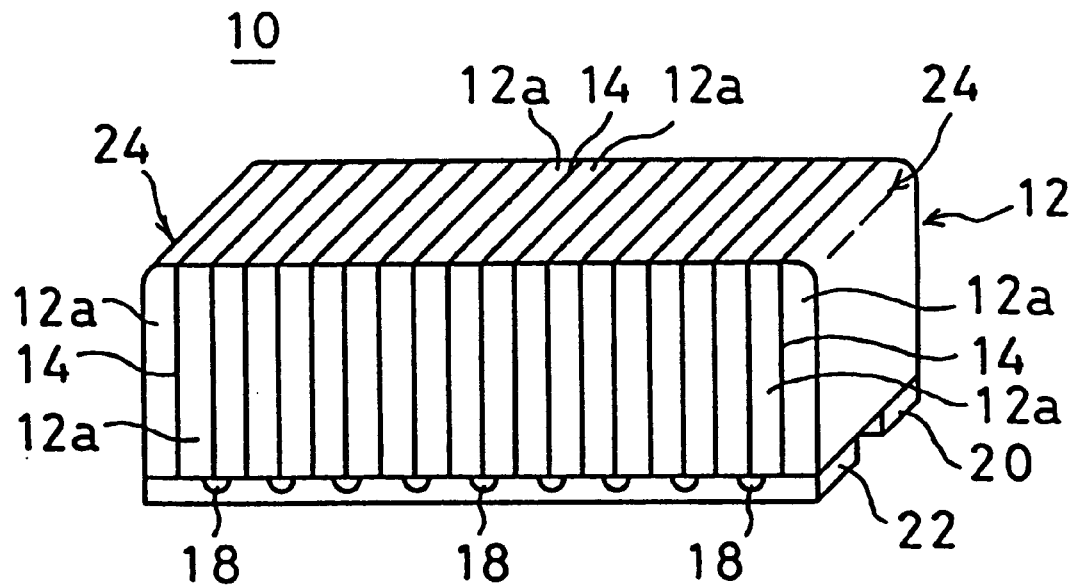
FIG. 5 is a diagram showing another modification of the piezoelectric resonator shown in FIGS. 1 and 2.

FIG. 5 is a diagram showing another modification of the piezoelectric resonator shown in FIGS. 1 and 2. In comparison with the piezoelectric resonator shown in FIGS. 1 and 2, the piezoelectric resonator shown in FIG. 5 is characterized in that the surface of each cut portion 24 has a substantially curved configuration.

Figure 6:
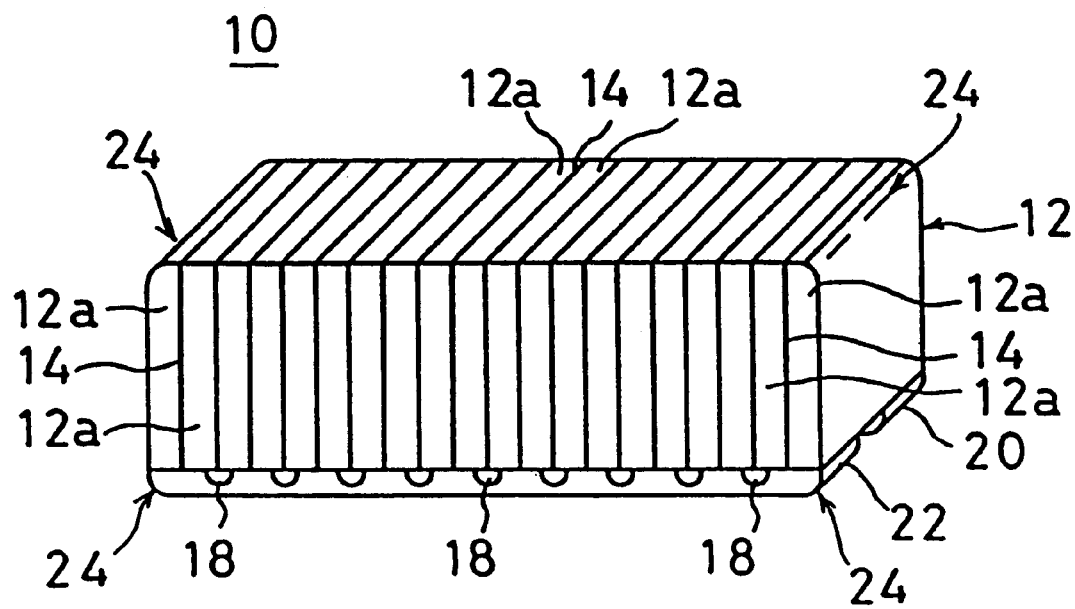
FIG. 6 a diagram showing a modification of the piezoelectric resonator shown in FIG. 4.

FIG. 6 is a diagram showing a modification of the piezoelectric resonator shown in FIG. 4. In comparison with the piezoelectric resonator shown in FIG. 4, the piezoelectric resonator shown in FIG. 6 is characterized in that the surface of each cut portion 24 is substantially curved.

The piezoelectric resonators shown in FIGS. 4, 5, and 6 provide the advantages achieved by the piezoelectric resonator shown in FIGS. 1 and 2 by the effect of cut portions 24 being formed at edge portions of the base member 12 at the opposite ends in the longitudinal direction in the same manner as those in the piezoelectric resonator shown in FIGS. 1 and 2.

Figure 7:
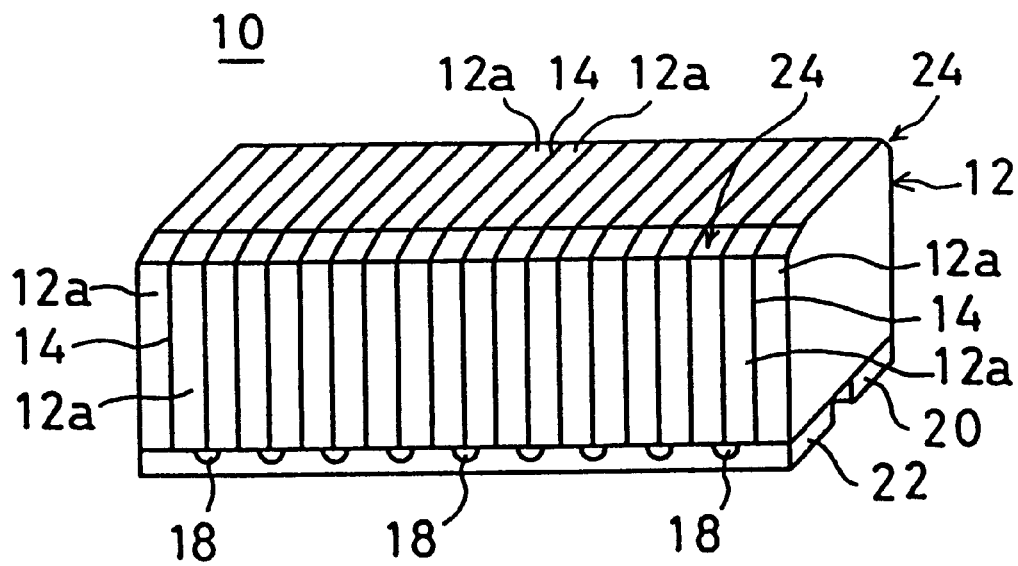
FIG. 7 is a diagram showing another preferred embodiment of the piezoelectric resonator in accordance with the present invention.
Figure 8:
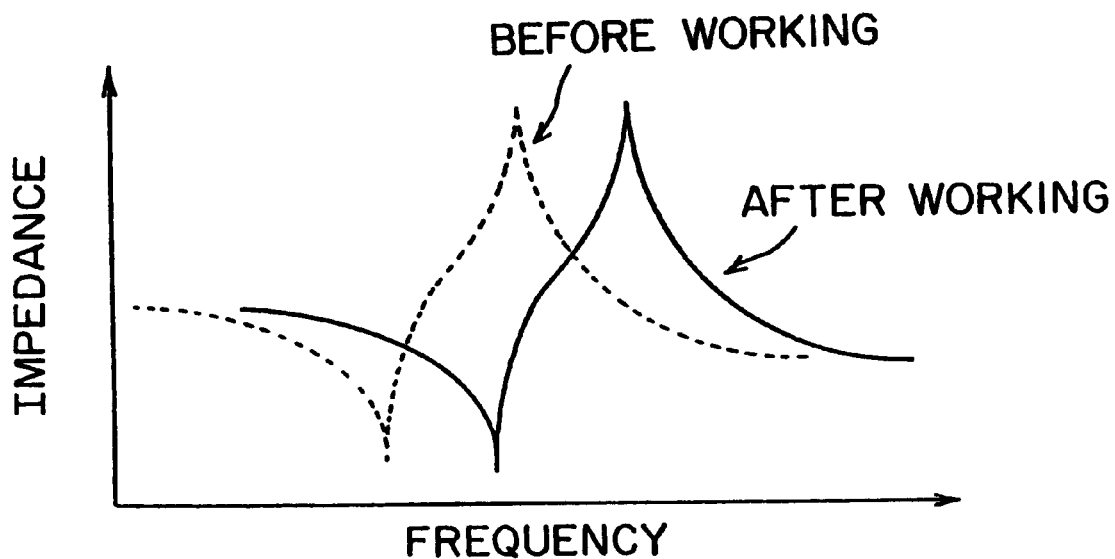
FIG. 8 is a graph showing a frequency characteristic of the piezoelectric resonator shown in FIG. 7 before cut portions are formed (before processing) and a frequency characteristic of the piezoelectric resonator after cut portions have been formed (after processing).

FIG. 7 is a diagram showing another preferred embodiment of the piezoelectric resonator in accordance with the present invention. In comparison with the piezoelectric resonator shown in FIGS. 1 and 2, the piezoelectric resonator shown in FIG. 7 is characterized in that cut portions 24 each having a substantially slanted flat surface are respectively formed at edge portions of the base member 12 at the opposite ends in the width direction of the side surface opposite from the one side surface on which external electrodes 20 and 22 are disposed. In contrast with the piezoelectric resonator shown in FIG. 24, the piezoelectric resonator shown in FIG. 7 has cut portions 24 formed at edge portions of the base member 12 at the opposite ends in the width direction to adjust a frequency thereof to a higher frequency. FIG. 8 shows a frequency characteristic of the piezoelectric resonator 10 shown in FIG. 7 before cut portions 24 are formed (before processing) and a frequency characteristic of the piezoelectric resonator 10 after cut portions 24 have been formed (after processing).

The piezoelectric resonator arranged as shown in FIG. 7 is also preferably a stiffed type piezoelectric resonator like the piezoelectric resonator shown in FIGS. 1 and 2. As a result, the resonator shown in FIG. 7 has a larger electromechanical coupling coefficient, a larger ΔF, and a characteristic of a wider band in comparison with unstiffened type piezoelectric resonators, and can be designed so as to avoid problems with automating of equipment for handling the piezoelectric resonator. Further, the resonator of FIG. 7 can be easily impedance-matched with an external circuit when mounted on a circuit board or the like.

Figure 9:
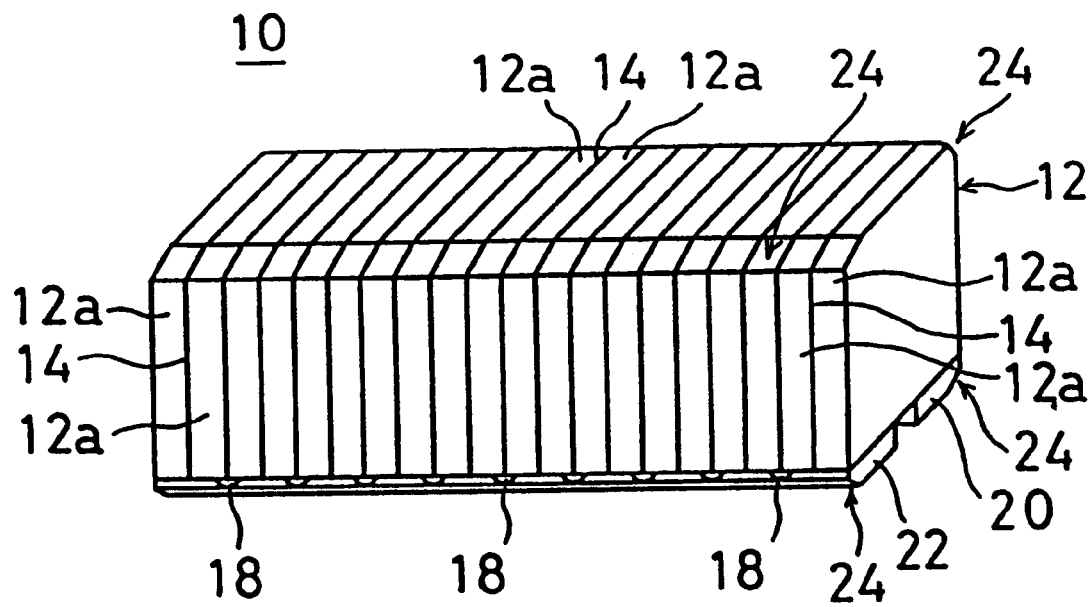
FIG. 9 is diagram showing a modification of the piezoelectric resonator shown in FIG. 7.

FIG. 9 is a diagram showing a modification of the piezoelectric resonator shown in FIG. 7. In comparison with the piezoelectric resonator shown in FIG. 7, the piezoelectric resonator shown in FIG. 9 is characterized in that cut portions 24 each having a substantially slanted flat surface are formed at edge portions of the base member 12 at the opposite ends in the width direction of each of two side surfaces of the base member 12 opposite from each other.

Figure 10:
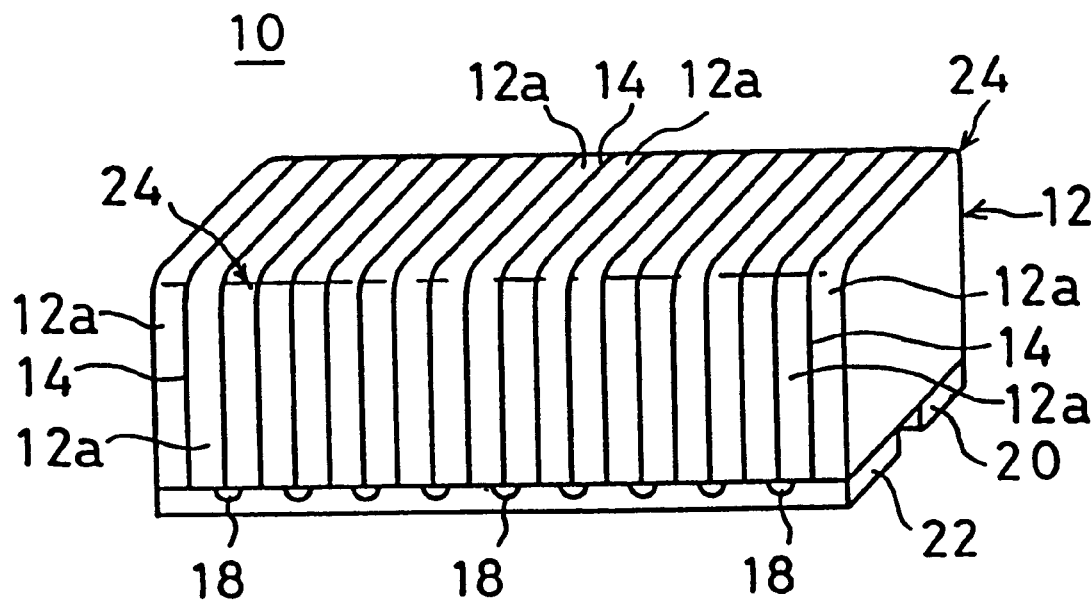
FIG. 10 is diagram showing another modification of the piezoelectric resonator shown in FIG. 7.

FIG. 10 is a diagram showing another modification of the piezoelectric resonator shown in FIG. 7. In comparison with the piezoelectric resonator shown in FIG. 7, the piezoelectric resonator shown in FIG. 10 is characterized in that the surface of each cut portion 24 is substantially curved.

Figure 11:
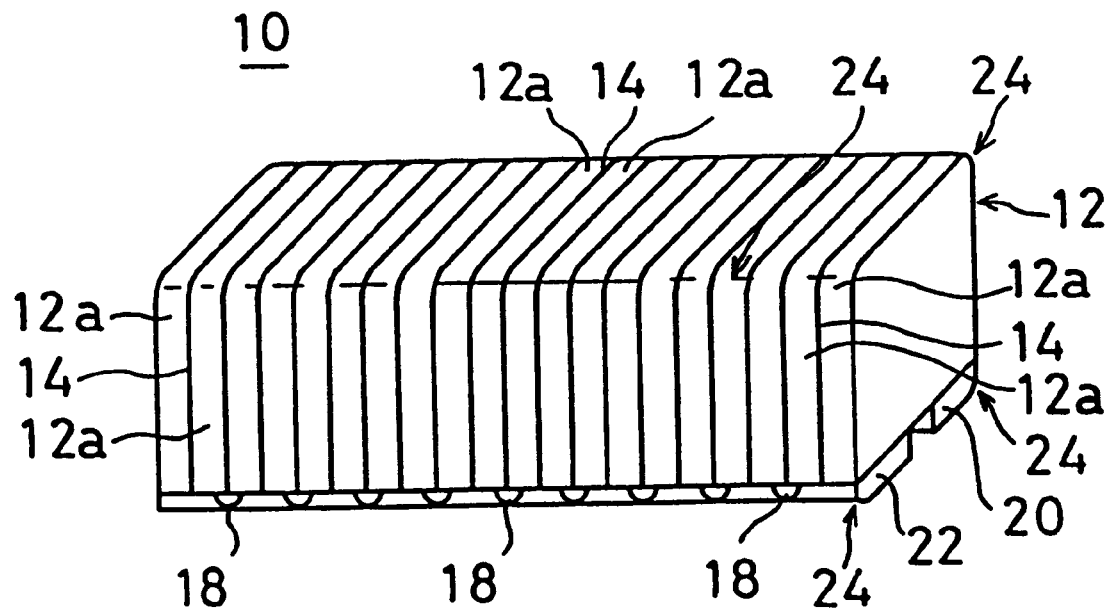
FIG. 11 is diagram showing a modification of the piezoelectric resonator shown in FIG. 9.

FIG. 11 is a diagram showing a modification of the piezoelectric resonator shown in FIG. 9. In comparison with the piezoelectric resonator shown in FIG. 9, the piezoelectric resonator shown in FIG. 11 is characterized in that the surface of each cut portion 24 is substantially curved.

The piezoelectric resonators shown in FIGS. 9, 10, and 11 are as advantageous as the piezoelectric resonator shown in FIG. 7 because of the effect of cut portions 24 being formed at edge portions of the base member 12 at the opposite ends in the width direction in the same manner as those in the piezoelectric resonator shown in FIG. 7.

Figure 12:
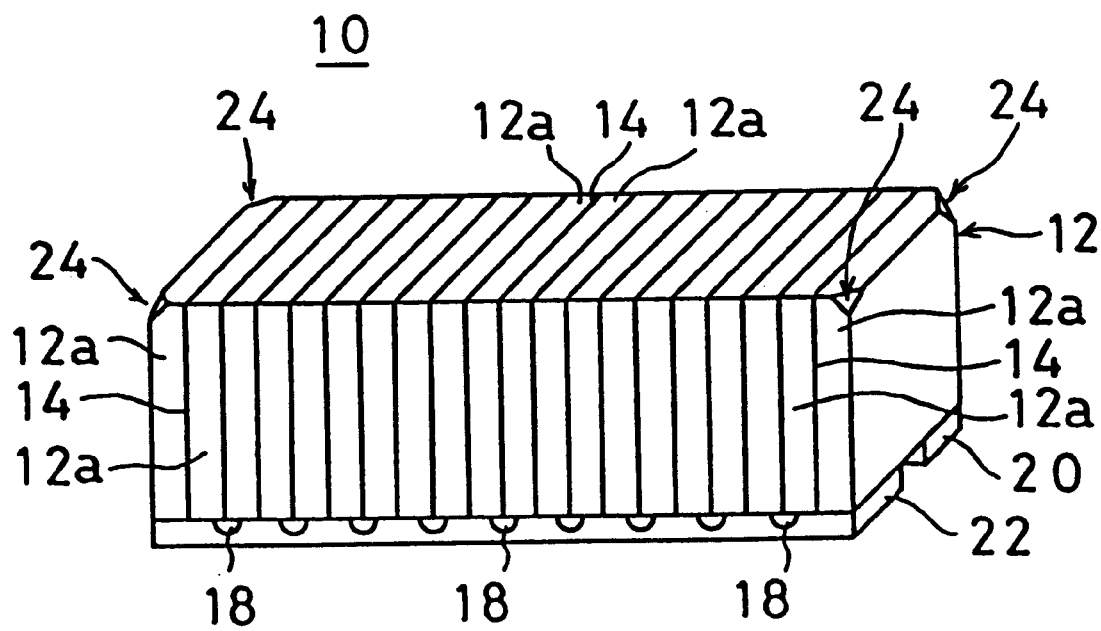
FIG. 12 is a diagram showing still another preferred embodiment of the piezoelectric resonator in accordance with the present invention.
Figure 13:
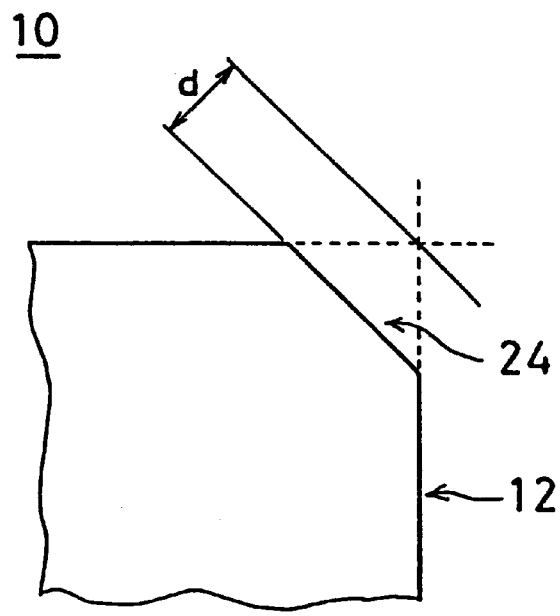
FIG. 13 is a diagram showing a cut portion in the resonator shown in FIG. 12.
Figure 14:
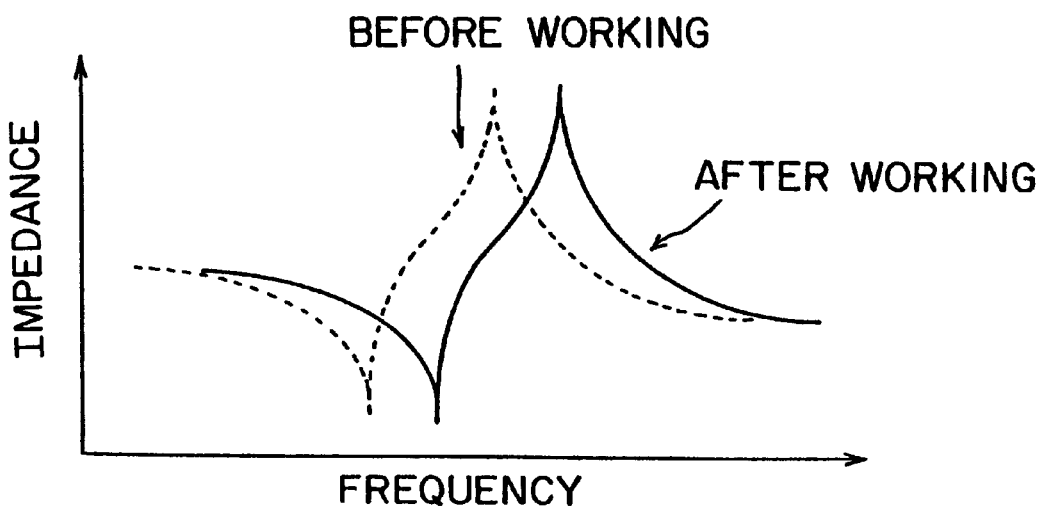
FIG. 14 is a graph showing a frequency characteristic of the piezoelectric resonator shown in FIG. 12 before cut portions are formed (before working) and a frequency characteristic of the piezoelectric resonator after cut portions have been formed (after working).

FIG. 12 is a diagram showing still another preferred embodiment of the piezoelectric resonator in accordance with the present invention, and FIG. 13 is a diagram showing a cut portion in the piezoelectric resonator shown in FIG. 12. In comparison with the piezoelectric resonator shown in FIGS. 1 and 2, piezoelectric resonator shown in FIG. 12 is characterized in that cut portions 24 each having a substantially slanted flat surface are respectively formed at corner portions of the base member 12 corresponding to the four corners of the surface opposite from the one surface on which external electrodes 20 and 22 are formed. In contrast with the piezoelectric resonator 1 shown in FIG. 24, the piezoelectric resonator 10 shown in FIG. 12 has cut portions 24 formed at four corner portions of the base member 12 to adjust its frequency to a higher frequency. FIG. 14 shows a frequency characteristic of the piezoelectric resonator 10 shown in FIG. 12 before cut portions 24 are formed (before processing) and a frequency characteristic of the piezoelectric resonator 10 after cut portions 24 have been formed (after processing).

The piezoelectric resonator shown in FIG. 12 is also preferably a stiffened type piezoelectric resonator like the piezoelectric resonator shown in FIGS. 1 and 2. As a result, the resonator shown in FIG. 12, has a larger electromechanical coupling coefficient, a larger ΔF, and a wider band in comparison with unstiffened type piezoelectric resonators, and can be designed so as to avoid problems with automating equipment for handling the piezoelectric resonator. Further, the resonator of FIG. 12 can be easily impedance-matched with an external circuit when mounted on a circuit board or the like.

Figure 15:
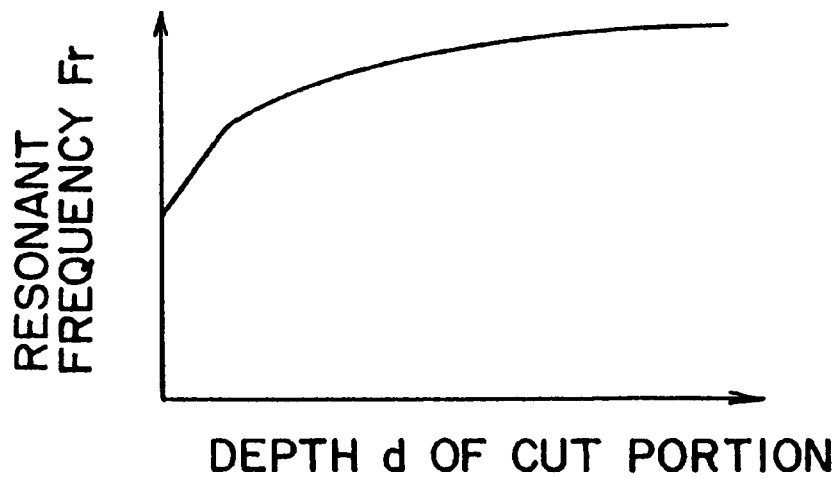
FIG. 15 is a graph showing the relationship between the depth d of the cut portions and the resonant frequency Fr in the piezoelectric resonator shown in FIG. 12.

FIG. 15 shows the relationship between a depth d of cut portions 24 and a resonant frequency Fr in the piezoelectric resonator 10 shown in FIG. 10. In the piezoelectric resonator 10 shown in FIG. 12, as is apparent from the relationship shown in FIG. 15, the resonant frequency Fr is proportional to the depth d of cut portions 24 when the depth d of cut portions 24 is small, that is, in an initial stage of forming cut portions 24. At this stage, therefore, the resonant frequency Fr can be easily adjusted. Other frequencies of the piezoelectric resonator 10 shown in FIG. 12, including an antiresonant frequency Fa, are also changed according to the depth d of cut portions 24, as is the resonant frequency Fr.

Frequencies of each of the piezoelectric resonators shown in FIGS. 1 to 11, including the resonant and antiresonant frequencies, are also changed according to the depth of cut portions 24, as are the frequencies of the piezoelectric resonator shown in FIG. 12.

Figure 16:
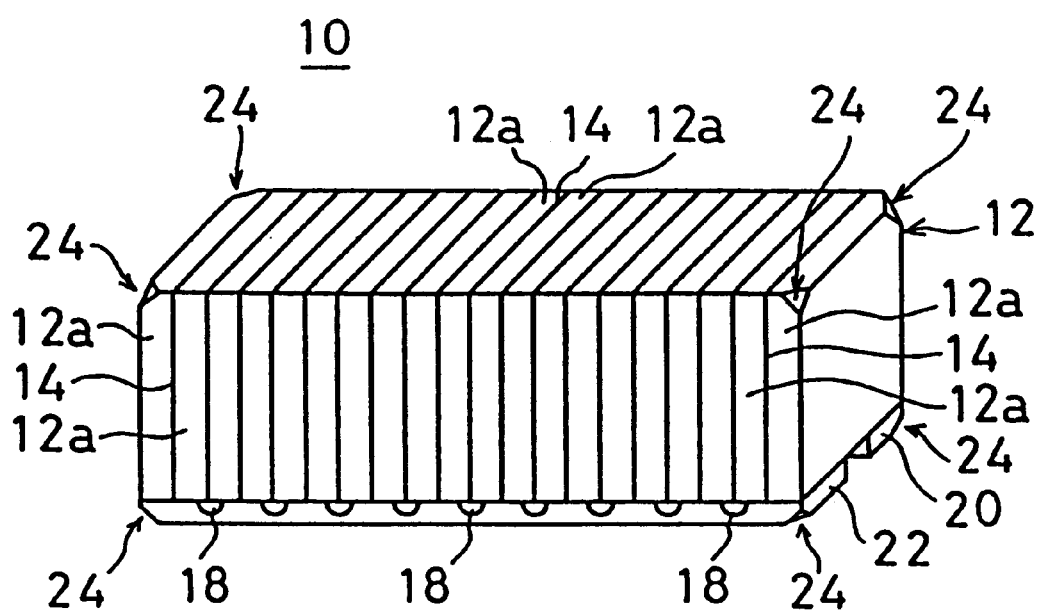
FIG. 16 is a diagram showing a modification of the piezoelectric resonator shown in FIG. 12.

FIG. 16 is a diagram showing a modification of the piezoelectric resonator shown in FIG. 12. In comparison with the piezoelectric resonator shown in FIG. 12, the piezoelectric resonator shown in FIG. 16 is characterized in that cut portions 24 each having a substantially slanted flat surface are formed at all corner portions, i.e., eight corner portions of the base member 12.

Figure 17:
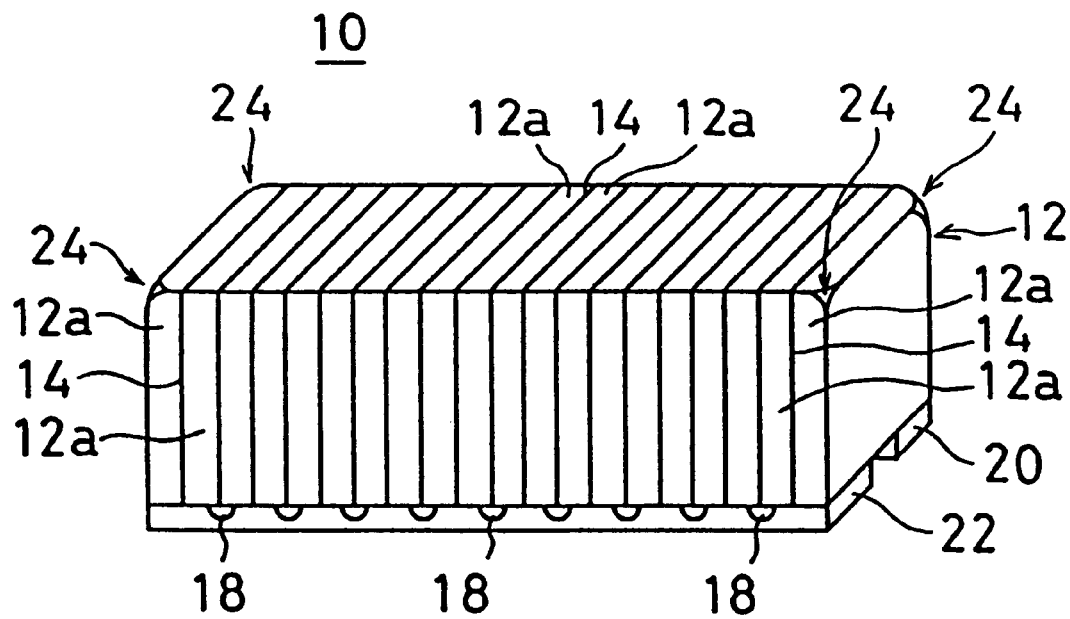
FIG. 17 is a diagram showing another modification of the piezoelectric resonator shown in FIG. 12.

FIG. 17 is a diagram showing another modification of the piezoelectric resonator shown in FIG. 12. In comparison with the piezoelectric resonator shown in FIG. 12, the piezoelectric resonator shown in FIG. 17 is characterized in that the surface of each cut portion 24 is substantially curved.

Figure 18:
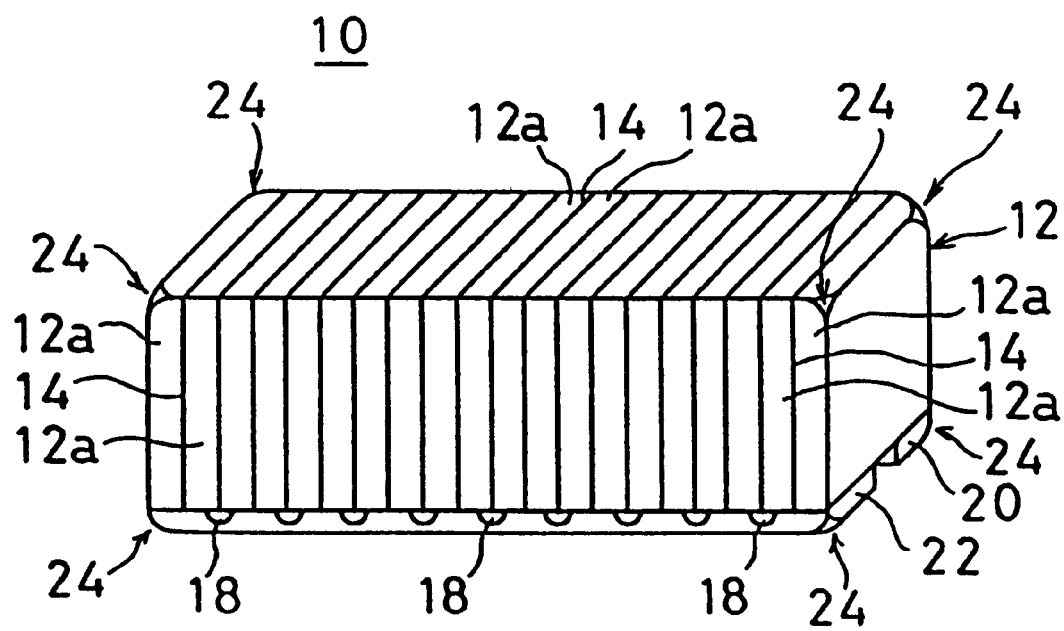
FIG. 18 is a diagram showing a modification of the piezoelectric resonator shown in FIG. 16.

FIG. 18 is a diagram showing a modification of the piezoelectric resonator shown in FIG. 16. In comparison with the piezoelectric resonator shown in FIG. 16, the piezoelectric resonator shown in FIG. 18 is characterized in that cut portions 24 each having a substantially curved flat surface are formed at all corner portions, i.e., at eight corner portions of the base member 12.

The piezoelectric resonators shown in FIGS. 16, 17, and 18 are as advantageous as the piezoelectric resonator shown in FIG. 12 because of the effect of cut portions 24 being formed at corner portions of the base member 12 in the same manner as the cut portions at the piezoelectric resonator shown in FIG. 12.

In each of the piezoelectric resonators shown in FIGS. 1 to 18, cut portions 24 may be formed by, for example, grinding the base member 12 with sandpaper or the like.

Figure 19:
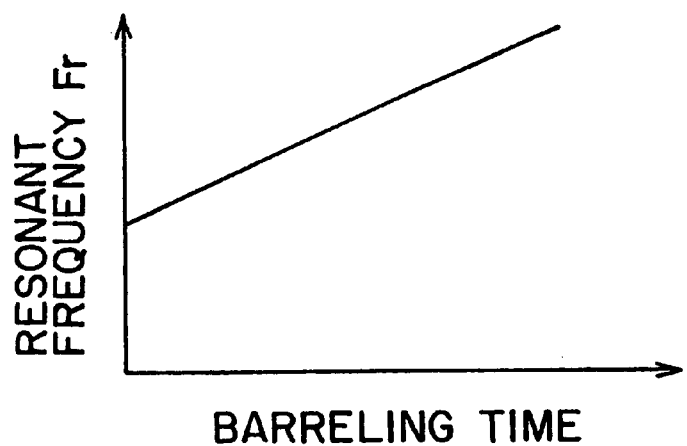
FIG. 19 is a graph showing the relationship between the resonant frequency and the time required for forming a cut portion in the piezoelectric resonator shown in FIG. 18.

In the piezoelectric resonator 10 shown in FIG. 18, cut portions 34 may alternatively be formed by, for example, grinding using a barrel. FIG. 19 shows the relationship between the time required for barreling for forming cut portions 24. As is apparent from the relationship shown in FIG. 19, the resonant frequency Fr of the piezoelectric resonator 10 shown in FIG. 18 is proportional to the barreling time, so that the resonant frequency Fr can be easily adjusted. The antiresonant frequency Fa and other frequencies of the piezoelectric resonator 10 shown in FIG. 19 also change similarly to the resonant frequency Fr, and can therefore be adjusted easily.

Figure 20:
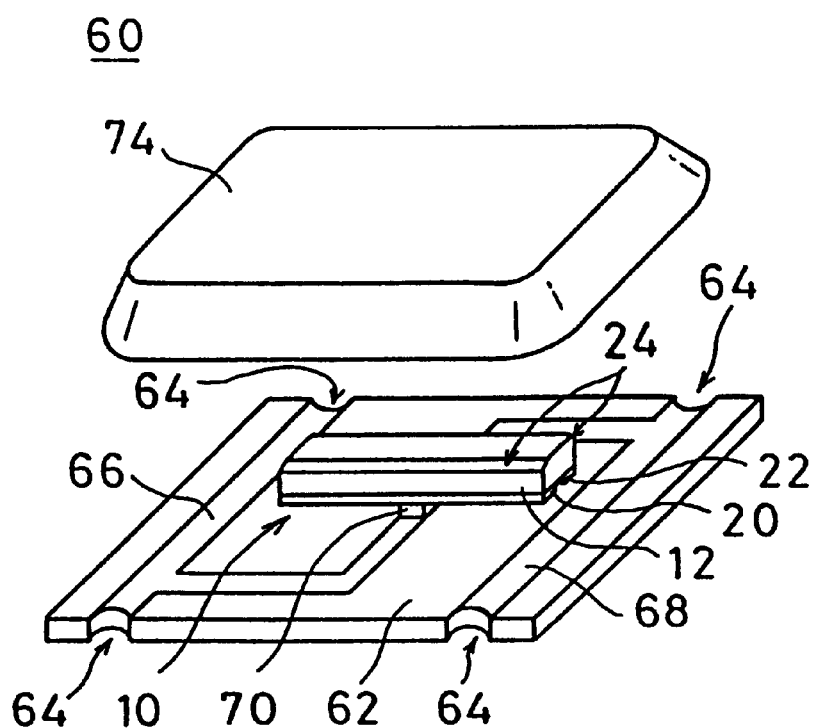
FIG. 20 is a diagram showing a preferred embodiment of an electronic component in which the piezoelectric resonator of the present invention is used.

An electronic component such as a vibrator or a discriminator can be manufactured by using each of the above-described piezoelectric resonators 10. Use of the piezoelectric resonator 10 shown in FIG. 7 will be described by way of example. FIG. 20 illustrates an electronic component 60, which includes an insulating material substrate 62 provided as a supporting member. Two pairs of recesses 64 are formed in opposite end portions of the insulating material substrate 62. Pattern electrodes 66 and 68 are disposed on one surface of the insulating material substrate 62. One pattern electrode 66 is provided between one opposite pair of the recesses 64 and has a portion extending in a substantially L-shaped configuration from its one end portion toward an approximate central portion of the insulating material substrate 62. The other pattern electrode 68 is provided between the other opposite pair of recesses 64 and has a portion extending in a substantially L-shaped configuration from its one end portion toward the approximate central portion of the insulating material substrate 62. These pattern electrodes 66 and 68 are provided so as to extend to the other side of the insulating material substrate 62 via the recesses 64 in a roundabout fashion.

Figure 21:
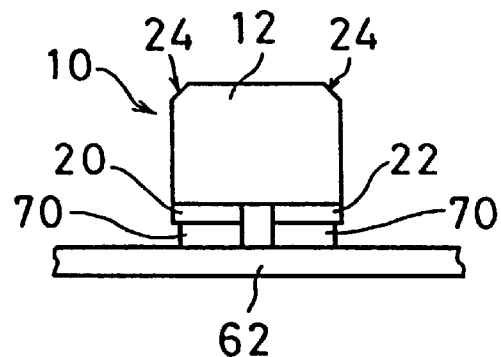
FIG. 21 is a side view of the mount structure for the piezoelectric resonator shown in FIG. 20.

An electroconductive adhesive or the like (not shown) is applied to end portions of the pattern electrodes 66 and 68 at the approximate center of the insulating material substrate 62. Mounting members 70 formed of an electroconductive paste or the like on the external electrodes 20 and 22 of the above-described piezoelectric resonator 10 substantially at the center of the electrodes in the longitudinal direction are mounted on the electroconductive adhesive on the end portions of the pattern electrodes 66 and 68, as shown in FIG. 21.

Further, a metallic cap 74 is placed on the insulating material substrate 62. To prevent conduction between the metallic cap 74 and the pattern electrodes 66 and 68 when the cap 74 is mounted, an insulating material such as an insulating resin is applied on the insulating material substrate 62 and the pattern electrodes 66 and 68. Thereafter, the metallic cap 74 is set. In this manner, the electronic component 60 is manufactured. In this electronic component 60, the pattern electrodes 66 and 68 arranged so as to extend to the other side of the insulating material substrate 62 via the recesses 64 in a roundabout fashion are used as input and output terminals for connection to an external circuit.

In this electronic component 60, mounting members 70 are provided and a central portion of the piezoelectric resonator 10 is fixed on the mounting members 70. The ends of the piezoelectric resonator 10 are thereby spaced apart from the insulating material substrate 62, so that vibration is not impeded. Also, since the central portion of the piezoelectric resonator corresponding to a nodal point is fixed by the mounting members 70, longitudinal vibration excited is not hindered.

This electronic component 60 is used as, for example, a discriminator by being mounted on a circuit board or the like together with an IC or the like. Since the electronic component 60 having such a structure is enclosed and protected in the metallic cap 74, it can be used as a chip component capable of being mounted by reflow soldering or the like.

In a case where this electronic component 60 is used as a vibrator, spurious resonance is limited since the above-described piezoelectric resonator 10 is used, thereby preventing abnormal oscillation due to spurious resonance. Also, impedance matching with an external circuit can be easily achieved because the capacitance value of the piezoelectric resonator 10 can be freely set. In particular, in the case of use of the resonator as a vibrator for a voltage controlled oscillator, a wide variable frequency range unattainable by the conventional devices can be obtained because ΔF of the resonator is large.

In a case where this electronic component 60 is used as a discriminator, the large ΔF of the resonator produces a wide separation. Further, since the capacitance design range of the resonator is wide, an impedance matching with an external circuit can be achieved easily. It is also possible to form a ladder type filter by using a plurality of piezoelectric resonators 10. Also in such a case, the degree of design freedom can be improved.

While the above-described electronic component is provided in a chip form, the electronic component in accordance with preferred embodiments of the present invention can be provided in any other different form. A structure corresponding to this preferred embodiment including any one of the piezoelectric resonators 10 other than that shown in FIG. 7 may be used.

Figure 22A:
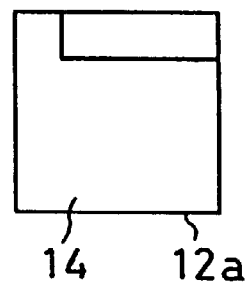
FIGS. 22A and B are plan views showing a modification of the electrodes used in the piezoelectric resonator.
Figure 22B:
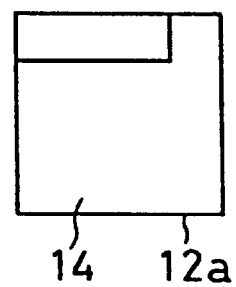

In each of the above-described piezoelectric resonators 10, an inner electrode 14 is preferably disposed over the entire area of the major surface of each piezoelectric layer 12a. According to preferred embodiments of the present invention, however, inner electrodes 14 may be provided in such a manner that one of the two groups of inner electrodes 14 alternating with each other have no portions provided on upper portions of the major surfaces of the piezoelectric layers 12a on one side, as shown in FIG. 22(a), while the other of the alternate inner electrodes 14 have no portions provided on upper portions of the major surfaces of the piezoelectric layers 12a on the other side, as shown in FIG. 22(b). If electrodes 14 are arranged in this manner, the ends of one of the alternate groups of electrodes 14 in one side surface of the base member 12 are not exposed at one end of the base member 12 in the width direction while the ends of the other alternate group of inner electrodes 14 are not exposed at the other end of the base member 12 in the width direction, thereby eliminating the need for insulating films 16 and 18.

In each of the above-described piezoelectric resonators 10, the plurality of piezoelectric layers 12a are polarized alternately in opposite directions. However, the direction of polarization of the plurality of piezoelectric layers is not limited to this.

Each of the above-described piezoelectric resonators 10 is formed so that the sizes of the piezoelectric layers 12 in the longitudinal direction of the base member 12 or the spaces between the adjacent electrodes 14 are substantially equal. However, it is not always necessary to set the these sizes or spaces equal to each other.

In each of the above-described piezoelectric resonators 10, one piezoelectric layer 12a is provided between each adjacent pair of inner electrodes 14. Alternately, a plurality of piezoelectric layers may be formed between each adjacent pair of electrodes 14.

Further, while in each of the above-described piezoelectric resonators 10, inner electrodes 14 connected to external electrodes 20 and 22 are alternately formed, it is not always necessary to alternately provide inner electrodes 14.

Also, while in each of the above-described piezoelectric resonators 10; cut portions 24 are formed at two or more places in the base member 12, a cut portion 24 may be formed as only one portion in an edge portion or a corner portion of the base member 12. Also in such a case, the invention has the same advantage. Further, cut portions 24 formed at edge and corner portions may be provided in different combinations.

Figure 23:
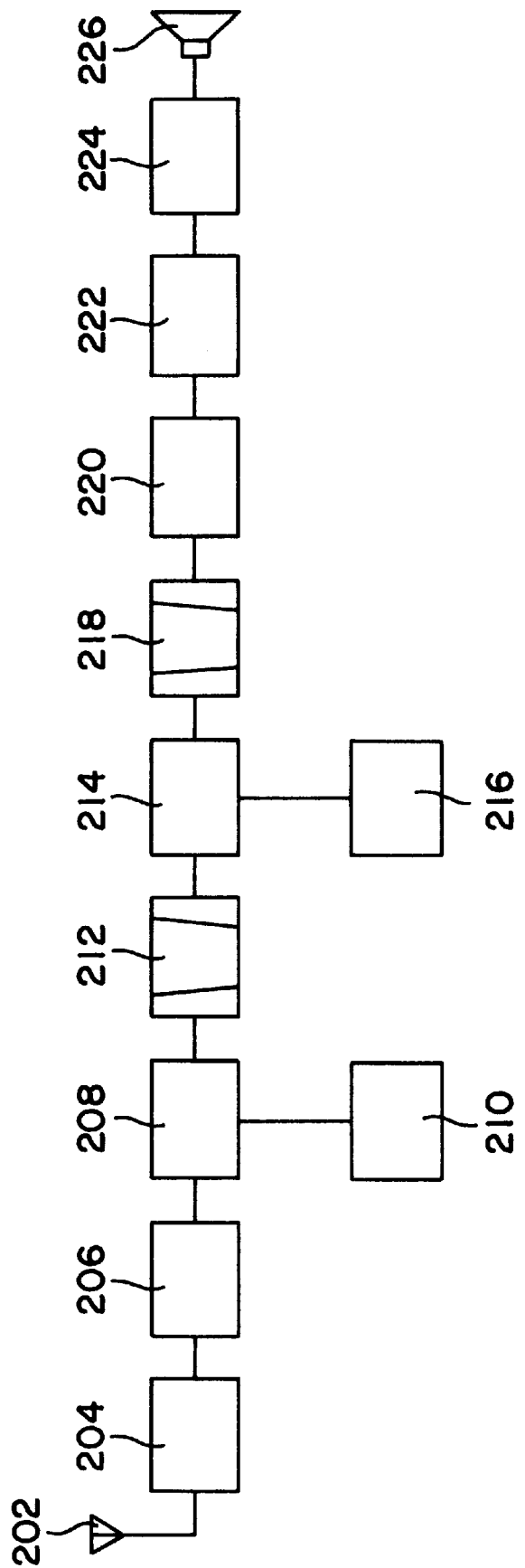
FIG. 23 is a block diagram showing a preferred embodiment of a double-super-heterodyne receiver according to the present invention.

FIG. 23 is a block diagram showing one preferred embodiment of a double-super-heterodyne receiver in accordance with the present invention. The super-heterodyne receiver 200 shown in FIG. 23 includes an antenna 202. The antenna 202 is connected to an input-end of an input-circuit 204. The input-circuit 204 performs an impedance matching between the antenna 202 and a high-frequency amplifier 206 which will be described below. A tuning circuit which selects a desired frequency or a band-pass filter is used as the input-circuit 204. An output-end of the input-circuit 204 is connected to an input-end of a high-frequency amplifier 206. The high-frequency amplifier 206 is used for improving a sensitivity by low-noise amplification of weak radio waves and for improving selectivity of image-frequencies. An output-end of the high-frequency amplifier 206 is connected to an input-end of a first frequency mixer 208. The first frequency mixer 208 is used for making a first integrated or differential intermediate-frequency by mixing a desired frequency and a first local oscillation frequency. The other input-end of the first frequency mixer 208 is connected to an output-end of a first local oscillator 210. The first local oscillator 210 is used for oscillating the first local oscillation frequency to generate the first intermediate-frequency. An output-end of the first frequency mixer 208 is connected to an input-end of a first band-pass filter 212. The first band-pass filter 212 is used for passing the first intermediate-frequency. An output-end of the first band-pass filter 112 is connected to one input-end of a second frequency mixer 214. The second frequency mixer 214 is used for making a second integrated or differential intermediate-frequency by mixing the first intermediate frequency and a second local oscillation frequency. The other input-end of the second frequency mixer 214 is connected to an output-end of a second local oscillator 216. The second local oscillator 116 is used for oscillating the second local oscillation frequency to generate the second intermediate-frequency. An output-end of the second frequency mixer 214 is connected to an input-end of a second band-pass filter 218. The second band-pass filter 218 is used for passing the second intermediate frequency. An output-end of the second band-pass filter 218 is connected to an input-end of an intermediate frequency amplifier 220. The intermediate frequency amplifier 220 is used for amplifying the second intermediate frequency. An output-end of the intermediate frequency amplifier 220 is connected to an input-end of a detector 222. The detector 222 is used for obtaining signal waves from the second intermediate frequency. An output-end of the second detector 222 is connected to an input-end of a low-frequency amplifier 224. The low-frequency amplifier 224 is used for amplifying the signal waves so that the signal waves can drive a speaker. An output-end of the low-frequency amplifier 224 is connected to a speaker 226.

In this preferred embodiment of the present invention, the above described piezoelectric resonator can be used as the detector 222 in the double-super-heterodyne receiver 200. In addition, the above described ladder-filter can be used as each of the first band-pass filter 212 and the second band-pass filter 218.

As the ladder-filter including the piezoelectric resonator, the ladder-filter disclosed in a Japanese Patent Laid-Open publication No. 51261/1998 for example, may be used. In the ladder-filter, four piezoelectric resonators are connected to each other in a ladder configuration.

Such a receiver 200 has a very small size and yet still achieves excellent receiving characteristics.

In a preferred embodiment of the present invention, the above described piezoelectric resonator can be used as a detector in a single-super-heterodyne receiver. Further, the above described ladder-filter can be used as a band-pass filter.

Similar to the above-described double-super-heterodyne receiver, such a single-super-heterodyne receiver also has a very small size and achieves excellent receiving characteristics.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:
   a base member having a longitudinal direction and constructed to vibrate in a longitudinal vibration mode, said base member including a plurality of piezoelectric material layers laminated to each other, said piezoelectric material layers being polarized along the longitudinal direction of said base member;
   a plurality of inner electrodes arranged substantially perpendicular to the longitudinal direction of said base member and arranged along the longitudinal direction of said base member while being spaced apart from each other, said inner electrodes being provided on surfaces of said piezoelectric material layers and arranged substantially perpendicular to the longitudinal direction of said base member; and
   a pair of external electrodes provided on a first surface of said base member and connected to said inner electrodes; wherein
   said base member has at least one cut portion at an edge portion thereof.

2. The piezoelectric resonator according to claim 1, wherein said at least one cut portion is arranged to increase a resonant frequency of the piezoelectric resonator.

3. The piezoelectric resonator according to claim 1, further comprising a plurality of cut portions, wherein each of said cut portions is located at a respective one of a plurality of corner portions of said base member.

4. The piezoelectric resonator according to claim 1, wherein said at least one cut portion has a substantially slanted configuration relative to said base member.

5. The piezoelectric resonator according to claim 1, wherein said at least one cut portion has a substantially curved configuration relative to said base member.

6. The piezoelectric resonator according to claim 5, wherein each of said at least two cut portions has a substantially slanted configuration relative to said base member.

7. The piezoelectric resonator according to claim 5, wherein each of said at least two cut portions has a substantially curved configuration relative to said base member.

8. The piezoelectric resonator according to claim 1, wherein the base member has eight corner portions and further comprising a plurality of cut portions each being located at a respective one of the eight corner portions of said base member.

9. A method for adjusting a frequency of a piezoelectric resonator, comprising the steps of:
   providing a piezoelectric resonator including a base member having a longitudinal direction and vibrated in a longitudinal vibration mode, said base member including a plurality of piezoelectric material layers laminated to each other, said piezoelectric material layers being polarized along the longitudinal direction of said base member, a plurality of inner electrodes arranged substantially perpendicular to the longitudinal direction of said base member and arranged along the longitudinal direction of said base member while being spaced apart from each other, said inner electrodes being provided on surfaces of said piezoelectric material layers and arranged substantially perpendicular to the longitudinal direction of said base member, and a pair of external electrodes provided on a first surface of said base member and connected to said inner electrodes; and
   removing at least a portion of said base member at a least one edge portion of said base member.

10. A method according to claim 9, wherein said portion of said base member removed in said step of removing is located at a corner of said base member.

11. The method according to claim 9, wherein said step of removing said portion of said base member is done such that a resonant frequency of the piezoelectric resonator is increased.

12. The method according to claim 9, further comprising the step of making a plurality of cut portions in said base member, wherein each of said cut portions is located at a respective one of a plurality of corner portions of said base member.

13. The method according to claim 9, wherein said at least one cut portion has a substantially slanted configuration relative to said base member.

14. The method according to claim 9, wherein said at least one cut portion has a substantially curved configuration relative to said base member.

15. The method according to claim 9, further comprising the step of making at least two of cut portions in said base member, wherein each of said at least two of said cut portions is located at a respective opposite end of said base member.

16. The method according to claim 15, wherein each of said at least two cut portions has a substantially slanted configuration relative to said base member.

17. The method according to claim 15, wherein each of said at least two cut portions has a substantially curved configuration relative to said base member.

18. The piezoelectric resonator according to claim 9, wherein the base member has eight corner portions and further comprising the step of making a plurality of cut portions each at a respective one of the eight corner portions of said base member.

19. A communication apparatus including a detector, wherein said detector includes:

a base member having a longitudinal direction and constructed to vibrate in a longitudinal vibration mode, said base member including a plurality of piezoelectric material layers laminated to each other, said piezoelectric material layers being polarized along the longitudinal direction of said base member;

a plurality of inner electrodes arranged substantially perpendicular to the longitudinal direction of said base member and arranged along the longitudinal direction of said base member while being spaced apart from each other, said inner electrodes being provided on surfaces of said piezoelectric material layers and arranged substantially perpendicular to the longitudinal direction of said base member; and a pair of external electrodes provided on a first surface of said base member and connected to said inner electrodes; wherein said base member has at least one cut portion at an edge portion thereof.

20. A communication apparatus including a band-pass filter, wherein said band-pass filter comprises a ladder-filter including a piezoelectric resonator including:

a base member having a longitudinal direction and constructed to vibrate in a longitudinal vibration mode, said base member including a plurality of piezoelectric material layers laminated to each other, said piezoelectric material layers being polarized along the longitudinal direction of said base member;

a plurality of inner electrodes arranged substantially perpendicular to the longitudinal direction of said base member and arranged along the longitudinal direction of said base member while being spaced apart from each other, said inner electrodes being provided on surfaces of said piezoelectric material layers and arranged substantially perpendicular to the longitudinal direction of said base member; and a pair of external electrodes provided on a first surface of said base member and connected to said inner electrodes; wherein said base member has at least one cut portion at an edge portion thereof.

\* \* \* \* \*